(12) United States Patent
Kwon et al.

(10) Patent No.: US 7,864,233 B2
(45) Date of Patent: Jan. 4, 2011

(54) IMAGE PHOTOGRAPHING DEVICE AND METHOD

(75) Inventors: Jae-hyun Kwon, Yongin-si (KR);
Won-hee Choe, Gyeongiu-si (KR);
Seong-deok Lee, Suwon-si (KR)

(73) Assignee: Samsung Electronics Co., Ltd.,
Suwon-Si (KR)

( * ) Notice: Subject to any disclaimer, the term of this patent is extended or adjusted under 35 U.S.C. 154(b) by 345 days.

(21) Appl. No.: 11/802,548

(22) Filed: May 23, 2007

(65) Prior Publication Data

US 2007/0285540 A1    Dec. 13, 2007

(30) Foreign Application Priority Data

Jun. 1, 2006    (KR)    ...................... 10-2006-0049392

(51) Int. Cl.
*H04N 5/335*    (2006.01)
(52) U.S. Cl. .................................... 348/272
(58) Field of Classification Search ......... 348/266–283; 359/885–891; 257/88, 89, 98, 432
See application file for complete search history.

(56) References Cited

U.S. PATENT DOCUMENTS

| | | | | |
|---|---|---|---|---|
| 4,688,085 A * | 8/1987 | Imaide | ......................... | 348/237 |
| 5,379,069 A | 1/1995 | Tani | | |
| 5,614,947 A * | 3/1997 | Tanizoe et al. | .............. | 348/241 |
| 5,914,749 A | 6/1999 | Bawolek et al. | | |
| 5,929,432 A | 7/1999 | Yamakawa | | |
| 6,657,663 B2 * | 12/2003 | Morris | ......................... | 348/273 |
| 7,170,046 B2 * | 1/2007 | Higashitsutsumi | .......... | 250/226 |
| 7,235,775 B2 * | 6/2007 | Masaki | ......................... | 250/226 |
| 7,274,393 B2 | 9/2007 | Acharya | | |
| 7,323,676 B2 * | 1/2008 | Duijve | ......................... | 250/226 |
| 2003/0098916 A1 * | 5/2003 | Noguchi | ..................... | 348/272 |
| 2004/0169749 A1 | 9/2004 | Acharya | | |
| 2005/0134697 A1 | 6/2005 | Mikkonen et al. | | |
| 2006/0017829 A1 | 1/2006 | Gallagher | | |
| 2006/0066738 A1 | 3/2006 | Hershey et al. | | |
| 2006/0124833 A1 | 6/2006 | Toda | | |
| 2009/0268043 A1 | 10/2009 | Olsen et al. | | |

FOREIGN PATENT DOCUMENTS

EP    1 594 321 A2    11/2005

(Continued)

OTHER PUBLICATIONS

U.S. Appl. No. 11/785,560, filed Apr. 18, 2007, Won-hee Choe et al., Samsung Electronics Co., Ltd.

(Continued)

*Primary Examiner*—Tuan Ho
*Assistant Examiner*—Tuan H Le
(74) *Attorney, Agent, or Firm*—Staas & Halsey LLP

(57) ABSTRACT

An image photographing device and method, with the image photographing device enhancing image sensitivity. The image photographing device may include a lens unit, a filter unit including a first filter region which filters a complementary color of a predetermined color from light incident through the lens unit, a second filter region limiting the incident light to a predetermined primary color, a third filter region which passes all wavelength bands of the incident light, and a fourth filter region which filters outs an infrared wavelength band of the incident light, and an image sensor unit detecting light that passed through the filter unit and sensing an image.

24 Claims, 6 Drawing Sheets

FOREIGN PATENT DOCUMENTS

| | | |
|---|---:|---:|
| EP | 1 630 871 A1 | 3/2006 |
| JP | 3-114388 | 5/1991 |
| JP | 6-6813 | 1/1994 |
| JP | 2002-142228 | 5/2002 |
| JP | 2004-304706 | 10/2004 |
| JP | 2005-6066 | 1/2005 |
| WO | 99/50682 | 10/1999 |
| WO | 00/57651 | 9/2000 |

OTHER PUBLICATIONS

Cover Page Of EP 1594321 A3 with corresponding European Search Report.
European Search Report issued Oct. 23, 2007 in corresponding European Patent Application No. 07108758-9-2202.
Japanese Office Action mailed Aug. 25, 2009 corresponds to Japanese Patent Application No. 2007-134324.
U.S. Office Action mailed Apr. 15, 2010 corresponds to Co-pending U.S. Appl. No. 11/785,560.

* cited by examiner

GREEN FILTER

MAGENTA FILTER

FIG. 4A

| Y | G | Y | G |
|---|---|---|---|
| W | C | IR | C |
| Y | G | Y | G |
| IR | C | W | C |

FIG. 4B

| C | B | C | B |
|---|---|---|---|
| W | M | IR | M |
| C | B | C | B |
| IR | M | W | M |

FIG. 4C

| M | R | M | R |
|---|---|---|---|
| W | Y | IR | Y |
| M | R | M | R |
| IR | Y | W | Y |

FIG. 4D

| C | IR | Y | W | G | W |
|---|---|---|---|---|---|
| W | G | W | C | IR | Y |

| IR | C | W | Y |
|----|---|---|---|
| W  | Y | IR | C |

R=aW-bC
B=cW-dY
G=eW-fR-gB+hG

R=aW-bC
B=cW-dY
G=VISIBLE LIGHT THAT PASSED THROUGH GREEN FILTER

R=aW-bC
G=cW-dM
B=eW-fR-gG+hB

R=aW-bC
G=cW-dM
B=VISIBLE LIGHT THAT PASSED THROUGH BLUE FILTER

G=aW-bM
B=cW-dY
R=eW-fG-gB+hR

G=aW-bM
B=cW-dY
R=VISIBLE LIGHT THAT PASSED THROUGH RED FILTER

US 7,864,233 B2

IMAGE PHOTOGRAPHING DEVICE AND METHOD

CROSS-REFERENCE TO RELATED APPLICATIONS

This application claims priority from Korean Patent Application No. 10-2006-0049392 filed on Jun. 1, 2006 in the Korean Intellectual Property Office, the disclosure of which is incorporated herein by reference in its entirety.

BACKGROUND OF THE INVENTION

1. Field of the Invention

One or more embodiments of the present invention relate to an image photographing device and method, and more particularly, to an image photographing device and method that can enhance image sensitivity.

2. Description of the Related Art

Recently, it has become popular for differing devices to be equipped with high-resolution cameras, such as digital personal assistants, digital cameras, and camera phones. Such devices with a high-resolution camera typically include a lens and an image sensor.

Here, the lens collects light reflected from a subject, and the image sensor detects the light collected by the lens and converts the detected light into an electrical image signal. Image sensors can be largely classified into image pickup tubes and solid-state image sensors. Major examples of the solid-state image sensors include a charge coupled device (CCD) and complementary metal oxide semiconductor (CMOS).

The image sensor included in the camera may include a color filter array (CFA) of color filters corresponding to pixels, respectively. Since the image sensor is sensitive to infrared light, an infrared filter is formed on the CFA to prevent image discoloration. As an example, the infrared filter, the CFA, and the image sensor can be manufactured as one module, with the infrared filter being separated a predetermined distance away from the image sensor, and the color filter array being stacked on the image sensor.

A primary color-based CFA and a complementary color-based CFA are two of the most widely used CFAs. The primary color-based CFA limits an incident light to any one of three primary colors, e.g., red, green and blue (RGB) as illustrated in FIG. 1. The complementary color-based CFA filters out a complementary color of an incident light using a complementary color filter composed of cyan, magenta and yellow, for example.

FIG. 1 illustrates an example of a green filter, and FIG. 2 illustrates an example of a magenta filter, which is a complementary color of green. In FIG. 1, since the incident light is limited, through the filtering, to green light, only ⅓ of the total light of the incident light is passed through the green filter. Hence, when the green filter, which is a primary color filter, is used, superior color reproducibility can be obtained, but there is a limit to enhancing sensitivity. In FIG. 2, green light, which is a complementary color of magenta, is filtered out from the incident light. Hence, ⅔ of the total light of the incident light is passed through the magenta filter. Hence, when the magenta filter is used, better sensitivity may be obtained than when the green filter of FIG. 1 is used, but color reproducibility is reduced.

Recently, the number of effective pixels included in a CMOS image sensor of a camera has increased in order to achieve higher resolutions. However, if the number of effective pixels is increased disproportionately with any increase in the size of the CMOS image sensor, the amount of light reaching each pixel becomes reduced, which, in turn, undermines sensitivity.

Japanese Patent Publication No. 2005-006066 discusses a color filter for a solid-state image pickup device. In this publication, the color filter includes RGB filters for enhancing color reproducibility and sensitivity and an infrared filter for filtering out infrared light. However, since the three-primary color filters are used to enhance color reproducibility, there is still a limit to enhancing sensitivity.

SUMMARY OF THE INVENTION

One or more embodiments of the present invention provide an image photographing device and method preventing a reduction in color reproducibility and maximizing image sensitivity even when pixels become very small and/or the density of the pixels increases without equally increasing the size of an image sensor.

Additional aspects and/or advantages of the invention will be set forth in part in the description which follows and, in part, will be apparent from the description, or may be learned by practice of the invention.

To achieve at least the above and/or other aspects and advantages, embodiments of the present invention include an image photographing device including a lens unit to control incident light, a filter unit including a first filter region to selectively pass through a complementary color of a predetermined color from the incident light, a second filter region to limit the incident light to a predetermined visually observable color light, a third filter region which passes the incident light in wavelength ranges at least beyond the visually observable color light, and a fourth filter region to limit the incident light in an infrared wavelength range, and an image sensor unit to sense an image based on light modified by the filter unit.

To achieve at least the above and/or other aspects and advantages, embodiments of the present invention include an image capturing device including a filter unit including a first filter region to selectively pass through a complementary color of a predetermined color from incident light to the filter unit, a second filter region to limit the incident light to visually observable color light, a third filter region to pass the incident light in wavelength ranges at least beyond the visually observable color light, and a fourth filter region to limit the incident light in an infrared wavelength range, and an image sensor unit to selectively combine filtered results of first and third filter regions to calculate at least two visually observable color lights of wavelength ranges different from the visually observable color light filtered by the second filter region, and to calculate color components of the incident light based upon the visually observable color light filtered by the second filter region and the at least two visually observable color lights.

To achieve at least the above and/or other aspects and advantages, embodiments of the present invention include an image photographing method, the method including filtering incident light through a first filter region that selectively passes through a complementary color of a predetermined color, a second filter region to limit the incident light to visually observable color light, a third filter region to pass the incident light in wavelength ranges at least beyond the visually observable color light, and a fourth filter region to limit the incident light in an infrared wavelength range, and sensing an image based on filtered results of the first, second, third, and fourth filter regions.

To achieve at least the above and/or other aspects and advantages, embodiments of the present invention include an image capturing method, including filtering incident light through a first filter region to selectively pass through a complementary color of a predetermined color from the incident light, a second filter region to limit the incident light to visually observable color light, a third filter region to pass the incident light in wavelength ranges at least beyond the visually observable color light, and a fourth filter region to limit the incident light in an infrared wavelength range, and selectively combining filtered results of first and third filter regions to calculate at least two visually observable color lights of wavelength ranges different from the visually observable color light filtered by the second filter region, to calculate color components of the incident light based upon the visually observable color light filtered by the second filter region and the at least two visually observable color lights, and to output at least one signal representative of the calculated color components of the incident light.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 4A through 4F illustrate a filter unit, according to differing example embodiments of the present invention;

FIG. 5 is a cross-sectional view of an image sensor unit, according to an embodiment of the present invention;

DETAILED DESCRIPTION OF THE PREFERRED EMBODIMENTS

Figure 1:
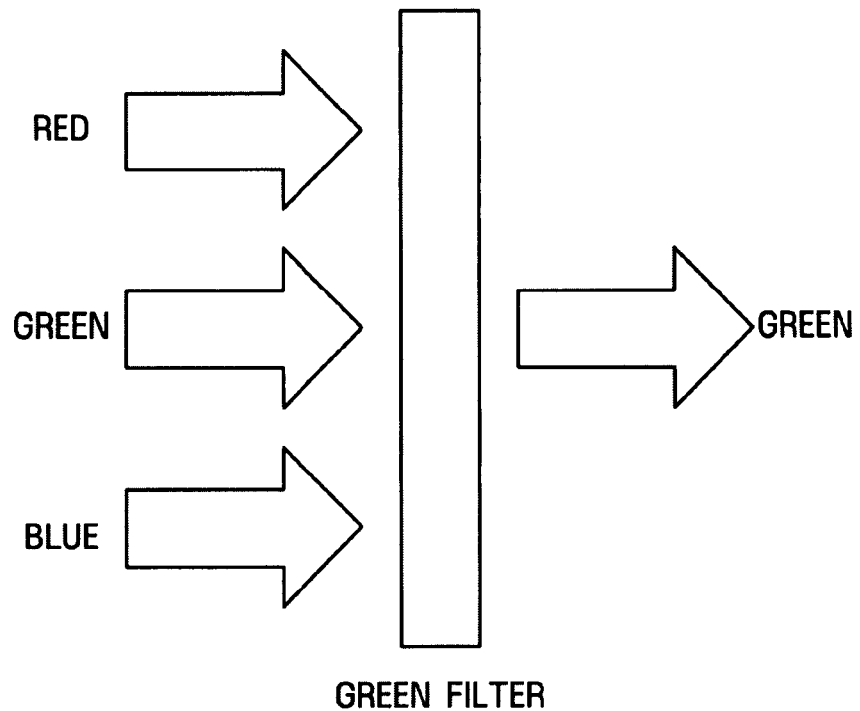
FIG. 1 illustrates a filtering process performed by a conventional primary color filter.
Figure 2:
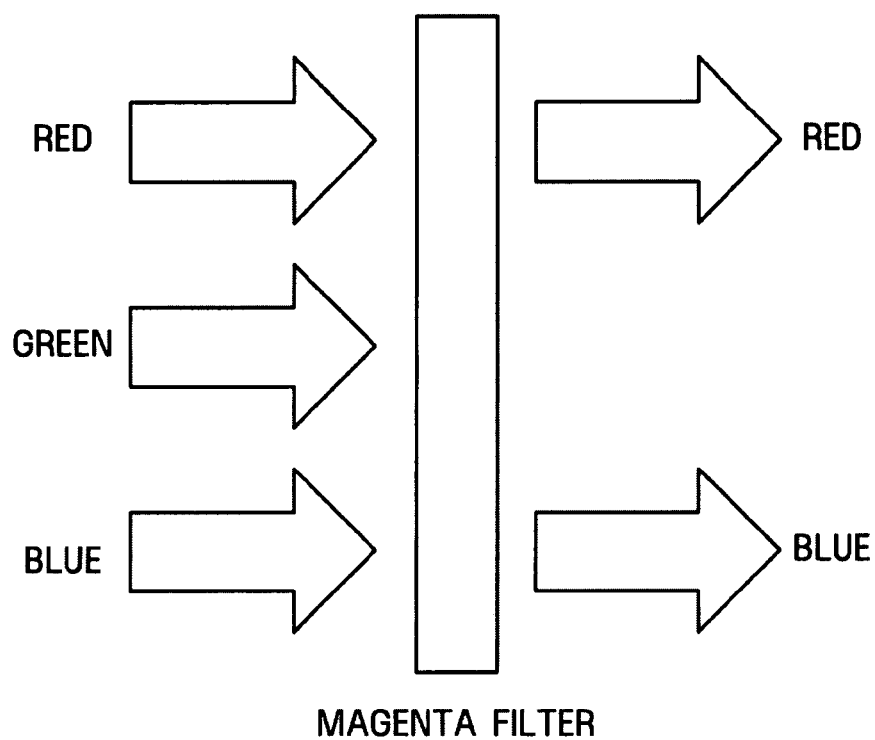
FIG. 2 illustrates a filtering process performed by a conventional complementary color filter.

Reference will now be made in detail to embodiments of the present invention, examples of which are illustrated in the accompanying drawings, wherein like reference numerals refer to the like elements throughout. Embodiments are described below to explain the present invention by referring to the figures.

Figure 3:
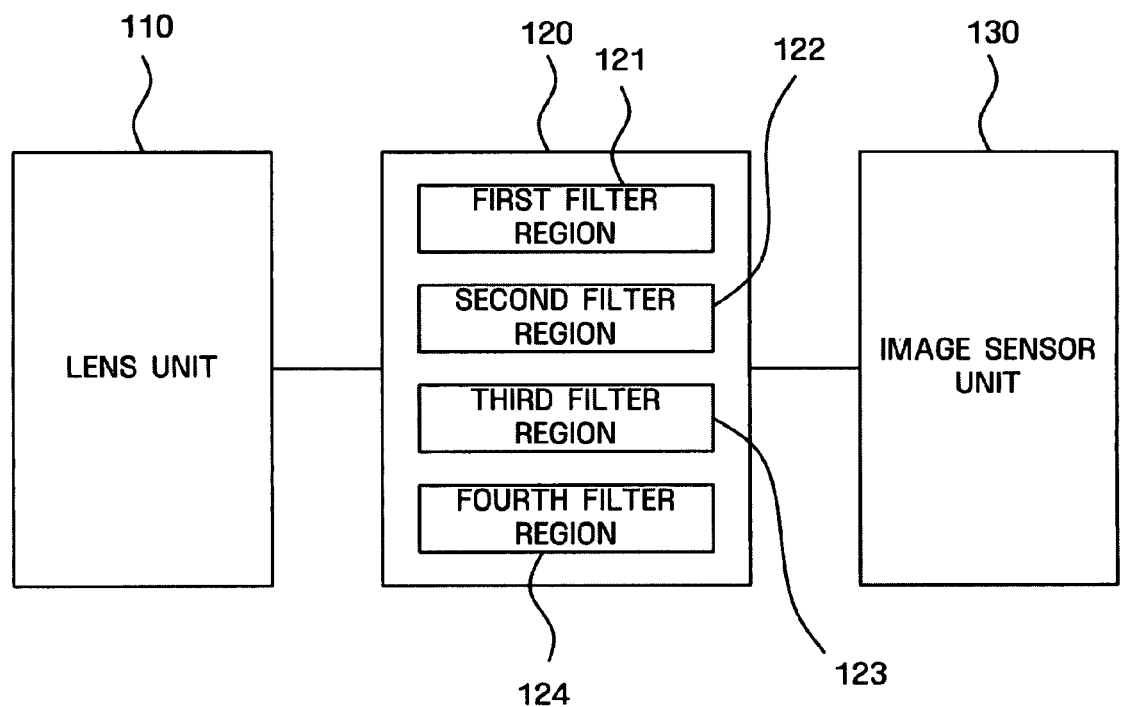
FIG. 3 illustrates an image photographing device, according to an embodiment of the present invention.

FIG. 3 illustrates an image photographing device 100, according to an embodiment of the present invention. Referring to FIG. 3, the image photographing device 100 may include a lens unit 110, a filter unit 120, and an image sensor unit 130, for example.

The image photographing device 100 may be understood to be a device, such as a digital camera, that can sense/store an image of a subject using a solid-state image sensor including a charge coupled device (CCD) and a complementary metal oxide semiconductor (CMOS). Such an image photographing device 100 may be a digital camera, a camera phone, or a personal digital assistant (PDA), for example, including such a solid-state image sensor, noting that embodiments of the present invention are not limited thereto.

The lens unit 110 may include at least one lens to collect incident light. In this case, the number of lenses may vary depending on use and need. Depending on embodiment, the lenses may be arranged in various forms on the same plane, e.g., the lenses may be arranged in a row or column or in a matrix with rows×columns. For convenience, embodiments described herein will be based on an assumption that the lens unit 110 includes only one lens, again noting that alternative embodiments are equally available.

The filter unit 120 may perform filtering of the light incident through the lens unit 110 while passing light of a predetermined wavelength band. In one embodiment, the filter unit 120 may include a first filter region 121 that filters out a complementary color of a predetermined color from the incident light, a second filter region 122 that limits the incident light to a predetermined primary color, a third filter region 123 that passes all wavelength bands of the incident light, and a fourth filter region 124 which filters outs an infrared wavelength band/range of the incident light.

Specifically, the first filter region 121 may include a complementary color filter to filter out, i.e., limit, a complementary color of a predetermined color from the incident light. In one embodiment, a case where two of cyan, magenta, and yellow filters are used as the complementary color filters of the first filter region 121 will be described. Here, these example filters are merely examples used to promote the understanding of the present invention, and the present invention is not limited thereto. For example, at least one of the cyan, magenta and yellow filters may selectively be used as the complementary color filters.

The second filter region 122 may include a primary color filter limiting the incident light to a predetermined primary color. In an embodiment, the primary color filter used in the second filter region 122 may be at least one of three primary color filters, e.g., red, green and blue (RGB) filters. As described above, a complementary color filter is used in the first filter region 121 and a primary color filter is used in the second filter region 122 because the complementary color filter of the first filter region 121 can increase the amount of light reaching the image sensor unit 130, which will be described later, thereby enhancing sensitivity while the primary color filter of the second filter region 122 can prevent reduction in color reproducibility.

The third filter region 123 may include a white filter passing all wavelength bands (i.e., wavelength ranges), for example, of the incident light. In one embodiment, the third filter region 123 may include a white filter, for example. Here, again, it is noted that embodiments of the present invention should not be limited to such a white filter or require that all wavelength bands be passed. In one example, the third filter region 123 may actually be accomplished by using no filter at all, to thereby pass all wavelength bands of the incident optical signal.

As described above, the third filter region 123 can pass all wavelength bands, for example, of the incident light in order to increase the amount of light reaching each pixel. In other words, if the number of effective pixels is increased, while the size of a complementary metal oxide semiconductor (CMOS) image sensor is limited or not correspondingly increased, the amount of light reaching each particular pixel may be reduced, which, in turn, undermines image sensitivity. Hence, if the third filter region 123 passes all wavelength bands of the incident light, the amount of light reaching the pixel can be increased.

The fourth filter region 124 may include an infrared filter filtering out an infrared wavelength band/range from the incident light in order to prevent image blurring, discoloration, and fogging caused by the high sensitivity of solid-state image sensors to infrared light.

The fourth filter region 124, as well as the third filter region 123, can thus increase the amount of light reaching each pixel, or increase the amount of light used to form pixel information for each pixel, and thus prevent sensitivity reduction.

Since the third filter region 123 passes all wavelength bands, for example, of the incident light and the fourth filter region 124 filters out the infrared wavelength band/range from the incident light, the image sensor unit 130, which will be described later, may calculate an infrared wavelength band based on the difference between wavelength bands of light that respectively passed through the third filter region 123 and the fourth filter region 124.

FIGS. 4A through 4F illustrate differing structures of the filter unit 120, according to example embodiments of the present invention. In FIGS. 4A through 4F, red, green, and blue filters, as example primary color filters, are indicated by "R", "G" and "B", respectively, and cyan, magenta and yellow filters, as example complementary color filters, are indicated by "C", "M" and "Y", respectively. Similarly, a white filter is indicated by "W", and an infrared filter is indicated by "IR".

As illustrated in FIGS. 4A through 4C, the filter unit 120 may include a complementary color filter selected from the cyan, magenta, and yellow filters, a primary color filter selected from the red, green and blue filters, the white filter, and the infrared filter, with corresponding pixels being arranged in an m×m matrix with an equal number of rows and columns, for example.

Figures 4E, 4F, 5:
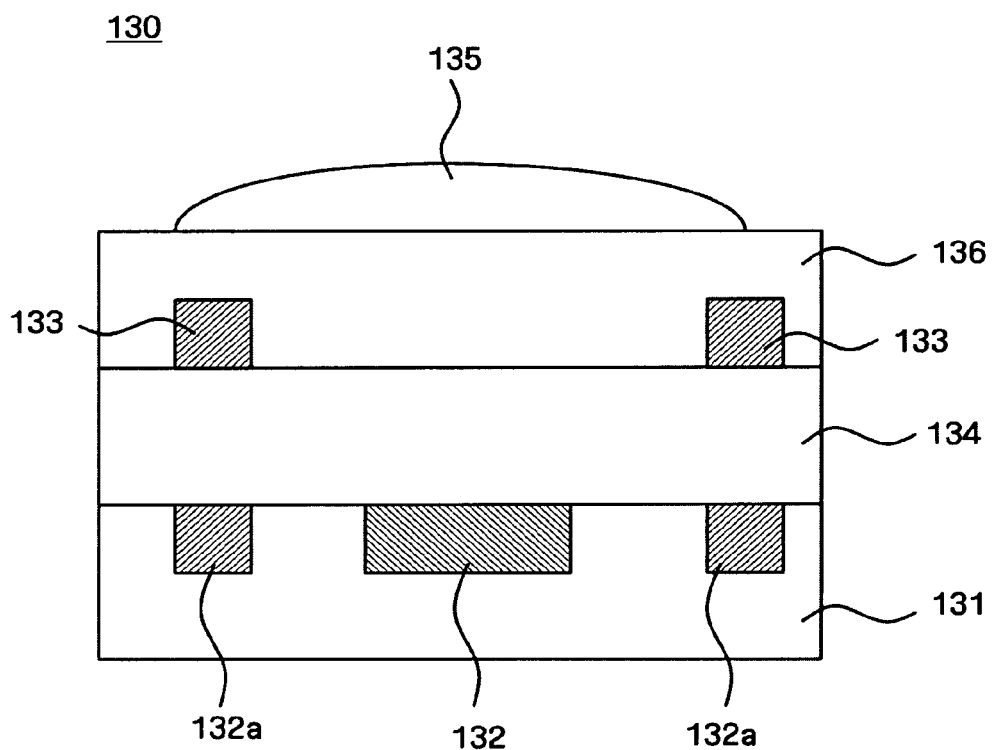

If the pixels are arranged in an n×m matrix, with a different numbers of rows and columns, or arranged in a diamond arrangement, the complementary color filter, the primary color filter, the white filter, and the infrared filter may further be arranged as illustrated in FIGS. 4D through 4F, for example.

Similar to above, FIGS. 4A through 4F are merely examples used to promote the understanding of the present invention. The complementary color filter, the primary color filter, the white filter, and the infrared filter may be arranged in various ways according to the arrangement of the pixels. Furthermore, the number of complementary color filters, primary color filters, white filters, and infrared filters may vary according to use and need. For example, when color reproducibility is considered to be a priority, the number of white filters may be reduced and the number of complementary color filters or primary color filters may be increased, compared to when sensitivity is considered as a priority.

In one embodiment, each filter unit 120, with respective first, second, third, and fourth filter regions, may be arranged in pixel units. More particularly, in an embodiment, each pixel may be represented by information derived from light filtered by at least one complementary color filter, at least one primary color filter, at least one white filter, and at least one infrared filter. In FIGS. 4A through 4F, only a portion of a potential entire filter unit 120 is illustrated. Therefore, there may be a plurality of filter units according to the number of pixels and image resolution. In other words, in the solid-state image sensor described above, filters included in the filter unit 120, according to embodiments of the present invention, may extend in horizontal, vertical, and/or diagonal directions.

The image sensor unit 130 senses the light that passed through the filter unit 120 for generating an image.

FIG. 5 is a cross-sectional view of an image sensor unit 130, according to an embodiment of the present invention. The image sensor unit 130 may corresponds to one pixel, such that the number of image sensors may be determined according to the number of pixels, for example.

Referring to FIG. 5, the image sensor unit 130 may include a substrate 131, a light-receiving device 132 formed on the substrate 131, a first insulation layer 134 formed on the substrate 131 and between the light receiving device 132 and a metal wiring layer 133, a micro-lens 135 formed on the metal wiring layer 133, and a second insulation layer 136 insulating the metal wiring layer 133.

The light-receiving device 132 may be an optical sensor such as a photodiode, a phototransistor, or a photoconductive cell. In addition, an isolation film 132a may be formed on one or more sides of the light receiving device 132 to isolate the light receiving device 132 from an adjacent light-receiving device, i.e., to isolate light-receiving devices arranged as pixels, respectively.

The micro-lens 135 may be used to increase the optical sensitivity of the light-receiving device 132. Generally, the physical size of the light-receiving device 132 may not directly correspond to the entire size of the pixel. Rather, the light-receiving device 132 may be sized smaller than the whole pixel. Without micro-lens 135, the proportion of the overall pixel area sensed by the light-receiving device 132 is less than 1, which denotes that some of an incident light would be lost. However, since the micro-lens 135 collects the incident light toward the light-receiving device 132, the amount of light converged on the light-receiving device 132 can be increased.

If the number of effective pixels is increased when the size of the CMOS image sensor is limited or not proportionally increased, the sizes of the light-receiving devices 132 included in corresponding image sensor units 130 are also reduced. Thus, if the size of the light-receiving device 132 is reduced, the amount of light reaching the light-receiving device 132 is reduced, which, in turn, undermines image sensitivity. However, the amount of light reaching the light-receiving device 132 can be increased using the third filter region 123 and the fourth filter region 124 described above. Consequently, the reduction of image sensitivity can be prevented while color reproducibility is enhanced.

The image sensor unit 130 may calculate an infrared wavelength band using light that respectively passed through the third filter region 123 and the fourth filter region 124. Then, the image sensor unit 130 may remove the calculated infrared wavelength band from the light that respectively passed through the complementary color filter and the primary color filter, respectively, and thus prevent image blurring, discoloration and fogging caused by the infrared wavelength band.

Specifically, if light that passed through the white filter is indicated by $I_{White}$ and light that passed through the infrared filter is indicated by $I_{IR\_Cut}$, the image sensor unit 130 may calculate an infrared wavelength band $I_{IR}$ using $I_{IR} = I_{White} - I_{IR\_Cut}$. If the filter unit 120 uses the cyan filter and the yellow filter as the complementary color filters, the green filter as the primary color filter, and the white filter, the image sensor unit 130 may remove the infrared wavelength band $I_{IR}$ from light that passed though each filter and thereby correct the light for infrared sensitivity. More specifically, if light that passed through the cyan filter is indicated by $I_{Cyan}$, light that passed through the yellow filter is indicated by $I_{Yellow}$, light that passed through the green filter is indicated by $I_{Green}$, and light that passed through the white filter is indicated by $I_{White}$, respective $I_{Cyan}'$, $I_{Yellow}'$, $I_{Green}'$ and $I_{White}'$ indicate light having the infrared wavelength band $I_{IR}$ removed, which may be further explained by the below Equation 1.

Equation 1:

$$I_{Cyan}' = I_{Cyan} - I_{IR}$$

$$I_{Yellow}' = I_{Yellow} - I_{IR}$$

$$I_{Green}' = I_{Green} - I_{IR}$$

$$I_{White}' = I_{White} - I_{IR}$$

If the light that passed through the cyan filter, the light that passed through the yellow filter, the light that passed through the green filter, and the light that passed through the white filter are corrected by removing the infrared wavelength band therefrom, e.g., using the above Equation 1, the image blurring, discoloration and fogging caused by the infrared wavelength band can be prevented.

After removing the infrared wavelength band from the light that respectively passed through the complementary color filter, the primary color filter, and the white filter included in the respective filter unit 120, the image sensor unit 130 may perform a demosaicing operation using an interpolation method. According to the interpolation method used by the image sensor unit 130, an image may be classified according to the color of each filter, and the color of an empty pixel may be filled using an average of pixels corresponding to a filter, noting that embodiments of the present invention are not limited to such an interpolation method.

After performing the demosaicing operation using light that respectively passed through the first filter region 121, the second filter region 122 and the third filter region 123, the image sensor unit 130 may perform a color mapping operation. In other words, the image sensor unit 130 may perform the color mapping operation using the light that respectively passed through the first filter region 121, the second filter region 122, and the third filter region 123 in order to produce the three primary colors, e.g., red, green and blue.

For example, if the cyan filter and the yellow filter are used as the complementary color filters of the first filter region 121, the green filter is used as the primary color filter of the second filter region 122, and the white filter is used in the third filter region 123, the image sensor unit 130 may perform the color mapping operation using light that passed through the green filter for the color green. In the case of the red and blue colors, the image sensor unit 130 may perform the color mapping operation using light that passed through the white filter and light that respectively passed through the cyan filter and the yellow filter, respectively. Specifically, to produce red, green and blue through a color mapping operation, according to one embodiment, based on the light that respectively passed through the white filter, the cyan filter, and the yellow filter, the image sensor unit 130 may use an equation "R=aW−bC, B=cW−dY, G=eW−fR−gB+hG" illustrated in FIG. 6. However, since the color mapping operation for the color green G is performed using the light that passed through the green filter, the equation may be simplified into "R=aW−bC, B=cW−dY, G=the light that passed through the green filter."

Figure 6:
FIGS. 6 through 8 illustrate color mapping methods, according to embodiments of the present invention.

In FIG. 6, R, G and B respectively indicate red, green and blue, W indicates light that passed through the white filter, C indicates light that passed through the cyan filter, and Y indicates light that passed through the yellow filter.

If the cyan filter and the magenta filter are used as the complementary color filters of the first filter region 121, a blue filter may be used as the primary color filter of the second filter region 122, and the white filter may be used in the third filter region 123. Here, the image sensor unit 130 may perform the color mapping operation using light that passed through the blue filter for the color blue. In the case of red and green, the image sensor unit 130 may perform the color mapping operation using light that passed through the white filter and light that respectively passed through the cyan filter and the magenta filter, respectively. Specifically, to produce red, green and blue through the color mapping operation based on the light that respectively passed through the white filter, the cyan filter, and the magenta filter, the image sensor unit 130 may use an equation "R=aW−bC, G=cW−dM, B=eW−fR−gG+hB" illustrated in FIG. 7. Again, as the color mapping operation can be performed using the light that passed through the blue filter for the color blue B, the equation may be simplified into "R=aW−bC, G=cW−dM, B=the light that passed through the blue filter."

If the magenta filter and the yellow filter are used as the complementary color filters of the first filter region 121, a red filter may be used as the primary color filter of the second filter region 122, and a white filter may be used in the third filter region 123. Here, the image sensor unit 130 may perform the color mapping operation using light that passed through the red filter for the color red. In the case of green and blue, the image sensor unit 130 may perform the color mapping operation using light that passed through the white filter and light that respectively passed through the magenta filter and the yellow filter, respectively. Specifically, to produce red, green and blue through the color mapping operation based on the light that respectively passed through the white filter, the magenta filter, and the yellow filter, the image sensor unit 130 may use an equation "G=aW−bM, B=cW−dY, R=eW−fG−gB+hR" illustrated in FIG. 7. Similar to above, since the color mapping operation can be performed using the light that passed through the red filter for the color red R, the equation may be simplified into "G=aW−bM, B=cW−dY, R=the light that passed through the red filter."

Figure 7:
Figure 8:

In FIGS. 6 through 8, R, G and B respectively indicate red, green and blue, W indicates light that passed through the white filter, C indicates light that passed through the cyan filter, Y indicates light that passed through the yellow filter, and M indicates light that passed through the magenta filter. In addition, a, b, c, d, e, f, g and h indicate weightings.

Next, the image sensor unit 130 may perform white balancing using the light that passed through the white filter of the third filter region 123. In addition, the image sensor unit 130 may further perform shading, color correction and gamma correction and generate an image. The image sensor unit 130 may still further cause the generated image to be displayed on a display module, for example.

Figure 9:
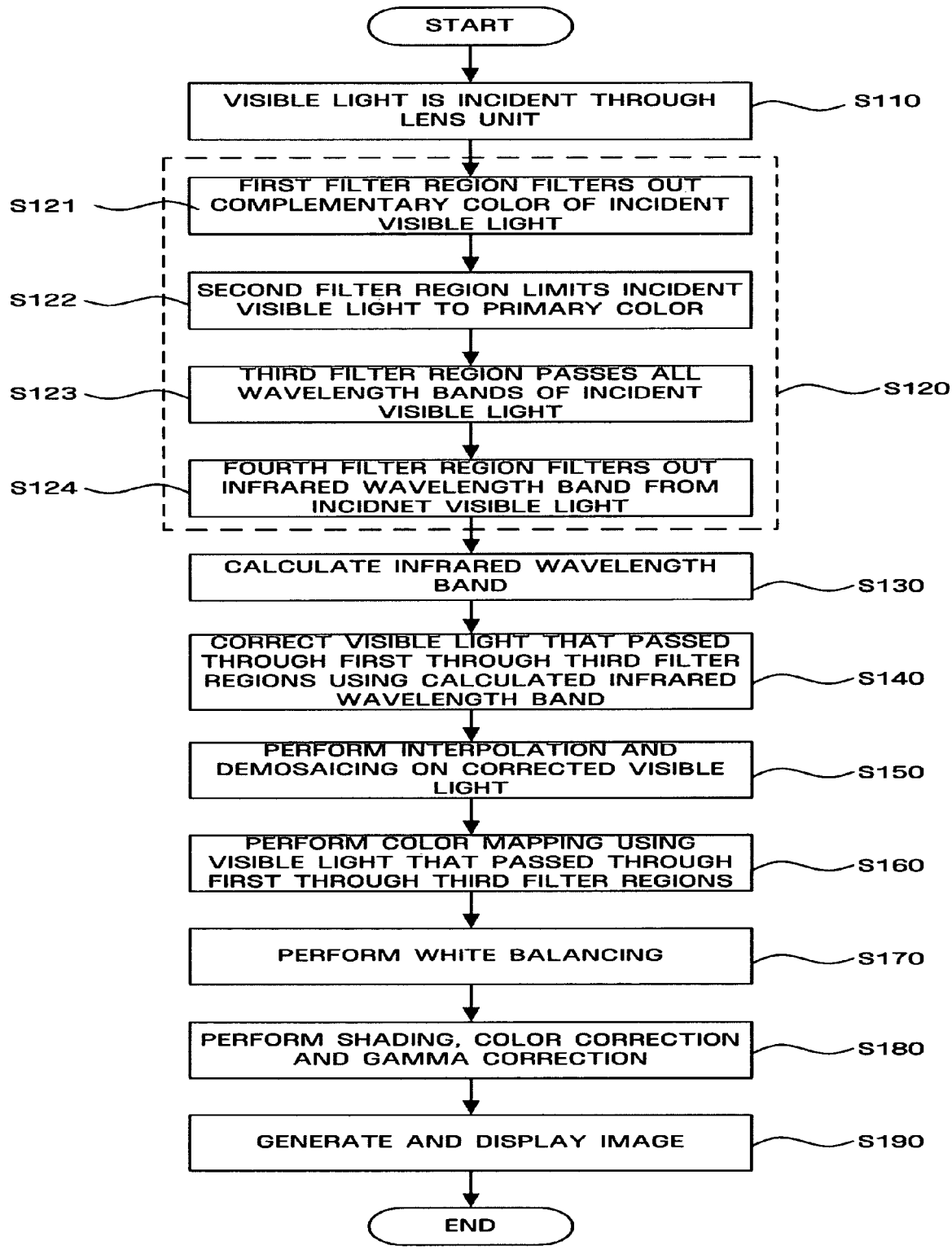
FIG. 9 illustrates an image photographing method, according to an embodiment of the present invention.

FIG. 9 illustrates an image photographing method, according to an embodiment of the present invention.

Referring to FIG. 9, when light is incident through a lens, e.g., the lens unit 110, in operation S110, each of the first through fourth filter regions, e.g., included in a filter unit 120, filters the incident light, in operation S120. Specifically, in operation S120, two complementary color filters, e.g., of the first filter region 121 included in the filter unit 120, may filter out a complementary color of a predetermined color from the incident light, in operation S121, a primary color filter, e.g., of the second filter region 122, may limit the incident light to a predetermined primary color, in operation S122, all wavelength bands of the incident light may be passed through, e.g., by the third filter region 123, and an infrared filter, e.g., of the fourth filter region 124, may filter outs an infrared wavelength band of the incident light, in operation S124.

In one embodiment, operations S121, S122, S123 and S124 may be sequentially performed. However, the present invention is not limited thereto, as operations S121, S122, S123 and S124 may be performed simultaneously, in a different order, or overlap in any manner.

In an embodiment, the image sensor unit 130 may calculate an infrared wavelength band using the light that passed through the third filter region 123 and the light that passed through the fourth filter 124, which may correspond to such a calculation in operation S130.

Here, in this embodiment, the image sensor unit 130 may correct the light that respectively passed through the first through third filter regions 121 through 123 by removing the calculated infrared wavelength band therefrom, in operation S140. For example, if the cyan filter is used in the first filter region 121, light that passed through the cyan filter contains an infrared wavelength band. Hence, the light that passed through the cyan filter may be corrected by removing the calculated infrared wavelength band therefrom.

In a further embodiment, the image sensor unit 130 may perform a demosaicing operation on the light which respectively passed through the first through third filter regions 121 through 123 and from which the infrared wavelength band has been removed, in operation S150.

Then, a color mapping operation, e.g., by the image sensor unit 130, may be performed, in operation S160. This color mapping operation may be performed using light from which a complementary color, e.g., corresponding to a complementary color filter used in the first filter region 121, is filtered out, light which is limited to a primary color, e.g., by a primary color filter used in the second filter region 122, and a white color, e.g., a white color that passed through the third filter region 123. In differing embodiments, the color mapping operation may be performed using any one of equations illustrated in FIGS. 6 through 8 according to complementary and primary color filters used in the first and second filter regions 121 and 122, for example.

Once the color mapping operation is completed, white balancing may be performed in operation S170, and shading, color correction and gamma correction, in operation S180, e.g., by the image sensor unit 130. Then, the image sensor unit 130, for example, may generate an image and display the generated image on a display module, in operation S190.

Thus, according to one or more embodiments of the present invention an image photographing device and method provide at least one of the following advantages.

Since a complementary color filter, a primary color filter and an infrared filter are used, a reduction in color reproducibility can be prevented, and the amount of light reaching a pixel can be increased, which, in turn, enhances sensitivity compared to conventional techniques.

An infrared filter may also be formed in a color filter array, together with the complementary color filter, the primary color filter, and the white filter, for example, resulting in a simplified manufacturing process.

In the case of one of three primary colors, a color mapping operation may further be performed using light that passed through a primary color filter corresponding to the primary color. In the case of the remaining primary colors, the color mapping operation can be performed using light that respectively passed through the complementary color filter and the white filter. Similarly, color mapping operations can be simplified.

Here, any use of the term 'unit', means, but is not limited to, a software and/or hardware component, such as a Field Programmable Gate Array (FPGA) or Application Specific Integrated Circuit (ASIC), which performs certain tasks. In one embodiment, a unit may advantageously be configured to reside on the addressable storage medium and configured to execute on one or more processors. Thus, a unit may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables, etc. The operations provided for in the components and units may be combined into fewer components and units or further separated into additional components and units.

Similarly, embodiments of the present invention may have been described with reference to block diagrams or flowchart illustrations. It should be understood that each block of the flowchart illustrations, and combinations of blocks in the flowchart illustrations, can thus also be implemented by computer program instructions.

In addition, each block of the flowchart illustrations may represent a module, segment, or portion of code, which includes one or more executable instructions for implementing the specified logical operation(s). It should also be noted that in some alternative implementations, the operations noted in the blocks may occur out of the order. For example, two blocks shown in succession may in fact be executed substantially concurrently or the blocks may sometimes be executed in the reverse order, depending upon the operations involved.

Still further, embodiments of the present invention can also be implemented through computer readable code/instructions in/on a medium, e.g., a computer readable medium, to control at least one processing element to implement any above described embodiment. The medium can correspond to any medium/media permitting the storing and/or transmission of the computer readable code.

The computer readable code can be recorded/transferred on a medium in a variety of ways, with examples of the medium including recording media, such as magnetic storage media (e.g., ROM, floppy disks, hard disks, etc.) and optical recording media (e.g., CD-ROMs, or DVDs), and transmission media such as carrier waves, as well as through the Internet, for example. Thus, the medium may further be a signal, such as a resultant signal or bitstream, according to embodiments of the present invention. The media may also be a distributed network, so that the computer readable code is stored/transferred and executed in a distributed fashion. Still further, as only an example, the processing element could include a processor or a computer processor, and processing elements may be distributed and/or included in a single device.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An image photographing device comprising:
   a lens unit to focus input light and output incident light toward a filter unit;
   the filter unit to filter the incident light, the filter unit comprising a first filter region configured to selectively pass through a complementary color of a predetermined color from the incident light, a second filter region configured to limit the incident light to a predetermined visually observable color light, a third filter region configured to pass the incident light in wavelength ranges at least beyond the visually observable color light, and a fourth filter region configured to limit the incident light in an infrared wavelength range; and
   an image sensor unit to sense an image based on light modified by the filter unit,
   wherein the image sensor unit uses sensed aspects of light exiting the third filter region and the fourth filter region to calculate the infrared wavelength range of the incident light based upon a difference between the sensed aspects of light exiting the third filter region and the sensed aspects of light exiting the fourth filter region, and wherein the image sensor unit corrects sensed aspects of light exiting at least one of the first filter region, second filter region, and third filter region by eliminating corresponding light aspects of the calculated infrared wavelength range from the sensed aspects of the light respectively exiting the first filter region, the second filter region, and the third filter region.

2. The device of claim 1, wherein the second filter region selectively passes light of at least one primary color.

3. The device of claim 2, wherein the first filter region comprises at least one of a cyan filter, a magenta filter, and a yellow filter, which are respective complementary color filters to at least one primary color other than the at least one primary color.

4. The device of claim 1, wherein the second filter region comprises at least one of a red filter, a green filter and a blue filter, as respective filters for the at least one primary color.

5. The device of claim 1, wherein the third filter region passes the incident light in all wavelength ranges.

6. The device of claim 1, wherein the third filter region comprises a white filter.

7. The device of claim 1, wherein the fourth filter region comprises an infrared filter.

8. The device of claim 1, wherein the image sensor unit corrects the sensed aspects of light exiting the first filter region, second filter region, and third filter region by eliminating the corresponding light aspects of the calculated infrared wavelength range from the sensed aspects of the light respectively exiting the first filter region, the second filter region, and the third filter region.

9. The device of claim 8, wherein the image sensor unit performs a color mapping operation using the respective corrected light aspects of light exiting the first filter region, the second filter region, and the third filter region.

10. An image photographing device comprising:
a lens unit to control incident light;
a filter unit comprising a first filter region to selectively pass through a complementary color of a predetermined color from the incident light, a second filter region to limit the incident light to a predetermined visually observable color light, a third filter region which passes the incident light in wavelength ranges at least beyond the visually observable color light, and a fourth filter region to limit the incident light in an infrared wavelength range; and
an image sensor unit to sense an image based on light modified by the filter unit,
wherein the image sensor unit uses sensed aspects of light exiting the third filter region and the fourth filter region to calculate the infrared wavelength range of the incident light based upon a difference between the sensed aspects of light exiting the third filter region and the sensed aspects of light exiting the fourth filter region,
wherein the image sensor unit corrects sensed aspects of light exiting the first filter region, second filter region, and third filter region by eliminating corresponding light aspects of the calculated infrared wavelength range from the sensed aspects of the light respectively exiting the first filter region, the second filter region, and the third filter region,
wherein the image sensor unit performs a color mapping operation using the respective corrected light aspects of light exiting the first filter region, the second filter region, and the third filter region, and wherein the image sensor unit selectively performs the color mapping operation using the corrected sensed aspects of light that exited the second filter region for identifying a corresponding one of three primary colors and performs the color mapping operation using corrected aspects of light that exited the first and third filter regions for identifying remaining primary colors other than the identified corresponding one of the three primary colors.

11. An image capturing device comprising:
a filter unit to filter incident light, the filter unit comprising a first filter region configured to selectively pass through a complementary color of a predetermined color from the incident light to the filter unit, a second filter region configured to limit the incident light to visually observable color light, a third filter region configured to pass the incident light in wavelength ranges at least beyond the visually observable color light, and a fourth filter region configured to limit the incident light in an infrared wavelength range; and
an image sensor unit to selectively combine filtered results of first and third filter regions to calculate at least two visually observable color lights of wavelength ranges different from the visually observable color light filtered by the second filter region, and to calculate color components of the incident light based upon the visually observable color light filtered by the second filter region and the at least two visually observable color lights,
wherein the calculated color components include a correction based only on filtered results from the third and fourth filter regions.

12. An image photographing method, the method comprising:
filtering incident light, the filtering of the incident light being through a filtering unit having at least a first, second, third, and fourth filter regions to filter the incident light, the first filter region being configured to selectively passes through a complementary color of a predetermined color from the incident light, the second filter region being configured to limit the incident light to visually observable color light, the third filter region being configured to pass the incident light in wavelength ranges at least beyond the visually observable color light, and the fourth filter region being configured to limit the incident light in an infrared wavelength range; and
sensing an image based on filtered results of the first, second, third, and fourth filter regions,
wherein the sensing of the image further comprises sensing aspects of light exiting the third filter region and the fourth filter region to calculate the infrared wavelength range of the incident light based upon a difference between the sensed aspects of light exiting the third filter region and the sensed aspects of light exiting the fourth filter region, and
wherein the sensing of the image further comprises correcting sensed aspects of light exiting at least one of the first filter region, second filter region, and third filter region by eliminating corresponding light aspects of the calculated infrared wavelength range from the sensed aspects of the light respectively exiting the first filter region, the second filter region, and the third filter region.

13. The method of claim 12, wherein the second filter region selectively passes light of at least one primary color.

14. The method of claim 13, wherein the first filter region comprises at least one of a cyan filter, a magenta filter, and a yellow filter, which are respective complementary color filters to at least one primary color other than the at least one primary color.

15. The device of claim 12, wherein the second filter region comprises at least one of a red filter, a green filter and a blue filter, as respective filters for the at least one primary color.

16. The method of claim 12, wherein the third filter region passes the incident light in all wavelength ranges.

17. The method of claim 12, wherein the third filter region comprises a white filter.

18. The method of claim 12, wherein the fourth filter region comprises an infrared filter.

19. The method of claim 12, wherein the sensing of the image further comprises correcting the sensed aspects of light exiting the first filter region, second filter region, and third filter region by eliminating the corresponding light aspects of the calculated infrared wavelength range from the sensed aspects of the light respectively exiting the first filter region, the second filter region, and the third filter region.

20. The method of claim 19, wherein the sensing of the image further comprises performing a color mapping operation using the respective corrected light aspects of light exiting the first filter region, the second filter region, and the third filter region.

21. The method of claim 20, wherein the sensing of the image further comprises selectively performing the color mapping operation using the corrected aspects of light that exited the second filter region for identifying a corresponding one of three primary colors and performs the color mapping operation using the corrected aspects of light that exited the first and third filter regions for identifying remaining primary colors other than the identified corresponding one of the three primary colors.

22. An image photographing device comprising:
   a lens unit focus input light and output incident light toward a filter unit;
   the filter unit comprising a first filter region to selectively pass through a complementary color of a predetermined color from the incident light, a second filter region to limit the incident light to a predetermined visually observable color light, a third filter region which passes the incident light in wavelength ranges at least beyond the visually observable color light, and a fourth filter region to limit the incident light in an infrared wavelength range; and
   an image sensor unit to sense an image based on light modified by the filter unit,
   wherein the image sensor unit corrects sensed aspects of light exiting the first filter region, second filter region, and third filter region by eliminating corresponding light aspects of light passed by the fourth light filter, and
   wherein the image sensor unit selectively performs a color mapping operation using the corrected sensed aspects of light that exited the second filter region for identifying a corresponding one of three primary colors and selectively performs a color mapping operation using corrected aspects of light that exited the first and third filter regions for identifying remaining primary colors other than the identified corresponding one of the three primary colors.

23. An image photographing device comprising:
   a lens unit to focus input light and output incident light toward a filter unit;
   the filter unit to filter the incident light, the filter unit comprising a first filter region configured to selectively pass through a complementary color of a predetermined color from the incident light, a second filter region configured to limit the incident light to a predetermined visually observable color light, a third filter region configured to pass the incident light in wavelength ranges at least beyond the visually observable color light, and a fourth filter region configured to limit the incident light in an infrared wavelength range; and
   an image sensor unit to detect a color based on the incident light as filtered by at least two of the first, second, and third filter regions after a correction, based on the incident light filtered by the third and fourth filter regions, of information derived from the at least two of the first, second, and third filter regions.

24. An image photographing method, the method comprising:
   filtering incident light, the filtering of the incident light being through a filtering unit having at least a first, second, third, and fourth filter regions to filter the incident light, the first filter region being configured to selectively passes through a complementary color of a predetermined color from the incident light, the second filter region being configured to limit the incident light to a predetermined visually observable color light, the third filter region being configured to pass the incident light in wavelength ranges at least beyond the visually observable color light, and the fourth filter region being configured to limit the incident light in an infrared wavelength range; and
   detecting a color based on the incident light as filtered by at least two of the first, second, and third filter regions after a correction, based on the incident light filtered by the third and fourth filter regions, of information derived from the at least two of the first, second, and third filter regions.

* * * * *